United States Patent
Reichert et al.

(10) Patent No.: US 11,334,690 B2
(45) Date of Patent: May 17, 2022

(54) METHOD FOR TRANSFORMING THE COMPUTER-AIDED DESIGN MODEL OF AN OBJECT

(71) Applicant: Universität Stuttgart, Stuttgart (DE)

(72) Inventors: Steffen Reichert, Stuttgart (DE); Long Nguyen, Stuttgart (DE); Achim Menges, Frankfurt (DE)

(73) Assignee: UNIVERSITÄT STUTTGART, Stuttgart (DE)

( * ) Notice: Subject to any disclaimer, the term of this patent is extended or adjusted under 35 U.S.C. 154(b) by 607 days.

(21) Appl. No.: 16/104,186

(22) Filed: Aug. 17, 2018

(65) Prior Publication Data
US 2019/0057167 A1 Feb. 21, 2019

(30) Foreign Application Priority Data
Aug. 17, 2017 (EP) ..................... 17186548

(51) Int. Cl.
*G06F 30/00* (2020.01)
*G06T 17/20* (2006.01)
(Continued)

(52) U.S. Cl.
CPC .............. *G06F 30/00* (2020.01); *G06F 30/15* (2020.01); *G06T 17/20* (2013.01); *G06T 19/20* (2013.01); *G06T 2219/2021* (2013.01)

(58) Field of Classification Search
CPC .......... G06F 30/00; G06F 30/15; G06F 30/23; G06F 17/00; G06F 17/16; G06F 3/048;
(Continued)

(56) References Cited

U.S. PATENT DOCUMENTS

| | | | | |
|---|---|---|---|---|
| 4,821,214 A | * | 4/1989 | Sederberg | G06T 19/20 345/420 |
| 5,796,400 A | * | 8/1998 | Atkinson | G06T 17/30 345/420 |

(Continued)

FOREIGN PATENT DOCUMENTS

| | | | |
|---|---|---|---|
| JP | 3420884 B2 * | 6/2003 | |
| WO | WO-2014195661 A1 * | 12/2014 | G06T 17/00 |

OTHER PUBLICATIONS

L. Baojun, Y. Lei, H. Ping and L. Xiuping, "Concurrent Editing of Styling and Structure of Auto Body Based on Metamodels," 2014 5th International Conference on Digital Home, Guangzhou, 2014, pp. 331-336, doi: 10.1109/ICDH.2014.69. (Year: 2014).*

(Continued)

*Primary Examiner* — Rehana Perveen
*Assistant Examiner* — Daniel E Miller
(74) *Attorney, Agent, or Firm* — Woodard, Emhardt, Henry, Reeves & Wagner, LLP

(57) ABSTRACT

A method of determining a modified shape of a computer-aided design model of an object or a partition thereof is described. With the method, at least two reference landmarks are placed at a reference position with respect to the shape of the object or to the partition. An adjustment landmark is placed at the reference position of the corresponding reference landmark. The adjustment landmarks are displaced from the reference position to a modified position, and a displacement between the modified position and the reference position is obtained. The modified shape of the object or the partition is generated by modifying the shape of the object or the partition by applying a homogeneous function of the displacement to the computer-aided design model of the shape of the object or the partition.

17 Claims, 5 Drawing Sheets

Figure 1A:
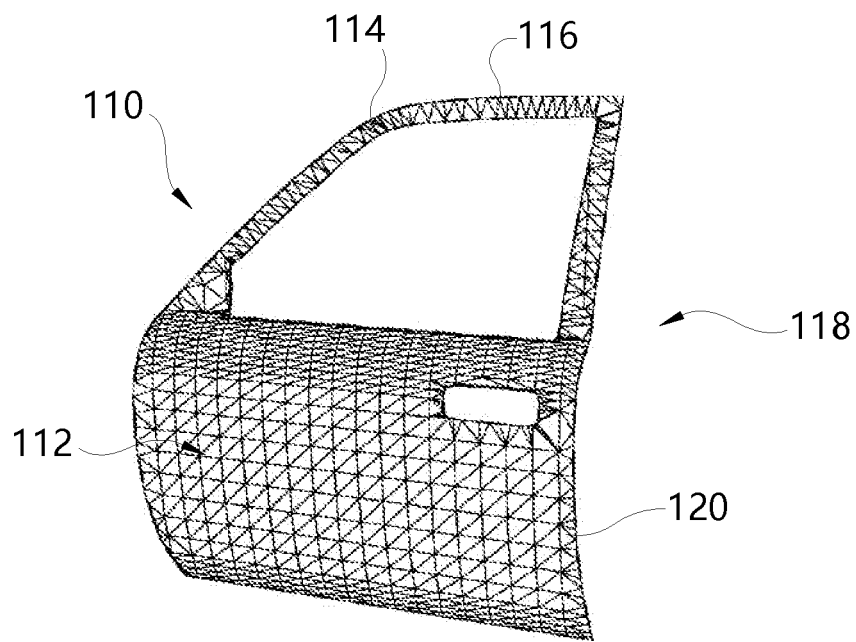

(51) Int. Cl.
*G06T 19/20* (2011.01)
*G06F 30/15* (2020.01)

(58) Field of Classification Search
CPC .. G06F 3/0484; G06F 3/04845; G06F 3/0486;
G06T 17/20; G06T 19/20; G06T
2219/2021; G06T 2219/20; G06T
2219/2016; G06T 2219/2024; Y10S
715/964
See application file for complete search history.

(56) References Cited

U.S. PATENT DOCUMENTS

| | | | | |
|---|---|---|---|---|
| 6,608,631 | B1* | 8/2003 | Milliron | G06T 13/00 345/619 |
| 9,330,206 | B2* | 5/2016 | Dean | A61B 5/103 |
| 9,495,726 | B1* | 11/2016 | Mariappasamy | G06T 3/0006 |
| 2003/0080957 | A1* | 5/2003 | Stewart | G06F 30/15 345/420 |
| 2007/0273688 | A1* | 11/2007 | Chen | G06T 17/20 345/420 |
| 2012/0221297 | A1* | 8/2012 | Nanson | G06T 19/00 703/1 |

OTHER PUBLICATIONS

C. Lorenz and N. Krahnstöver, "Generation of Point-Based 3D Statistical Shape Models for Anatomical Objects," Computer Vision and Image Understanding, vol. 77, Issue 2, 2000, pp. 175-191, https://doi.org/10.1006/cviu.1999.0814. (Year: 2000).*

Zeid, Ibrahim. Mastering CAD/CAM, 1st Edition. New York, McGraw-Hill, 2005. pp. 695, 723. ISBN 0-07-286845-7 (Year: 2005).*

Singh, Karan, and Eugene Fiume. "Wires: a geometric deformation technique." In Proceedings of the 25th annual conference on Computer graphics and interactive techniques, pp. 405-414. 1998. (Year: 1998).*

Bechmann, Dominique et al., "Arbitrary shaped deformations with DOGME". The Visual Computer (2003) vol. 19, pp. 175-186. 12 pages.

Dekkers, Ellen et al., "A Sketching Interface for Feature Curve Recovery of Free-Form Surfaces." Computer-Aided Design, vol. 43, Jul. 2011, pp. 771-780. 28 pages.

Gain, James et al., "A Survey of Spatial Deformation from a User-Centered Perspective." ACM Transactions on Graphics (2008), vol. 27, No. 4, Article 107. 21 pages.

Hsu, William M. et al., "Direct Manipulation of Free-Form Deformations." Computer Graphics, vol. 26, No. 2, Jul. 1992, pp. 177-184. 8 pages.

Lorenz, C. et al., "Generation of Point-Based 3D Statistical Shape Models for Anatomical Objects." Computer Vision and Image Understanding 77, 175-191 (2000). 17 pages.

Pernot, Jean-Philippe et al., "Ashape deformation tool to model character lines in the early design phases." SM I '02 Proceedings of the Shape Modeling International 2002 (SMI'02), p. 165. 9 pages.

Sederberg, Thomas W. et al.m, "Free-Form Deformation of Solid Geometric Models. "SIGGRAPH '86 Proceedings of the 13th annual conference on Computer graphics and interactive techniques, ACM SIGGRAPH Computer Graphics, vol. 20, Aug. 1986, pp. 151-160. 10 pages.

Sieger, Daniel et al., "Constrained space deformation techniques for design optimization." Computer-Aided Design, vol. 72, Mar. 2016, pp. 40-51. 13 pages.

Sinthanayothin, C. et al., "3D Deformable Mesh Aided Dentistry." [retrieved Sep. 3, 2015], 5 pages. Retrieved from the Internet: <URL: https://www.researchgate.net/profile/Chanjira_Sinthanayothin/publication/268043202_3D_Deformable_M.

* cited by examiner

METHOD FOR TRANSFORMING THE COMPUTER-AIDED DESIGN MODEL OF AN OBJECT

CROSS-REFERENCE TO RELATED APPLICATION

This application claims the benefit of European Application No. 17186548.8, filed Aug. 17, 2017, the entire disclosure of which is hereby incorporated by reference.

FIELD OF THE INVENTION

The present invention relates to a method for determining a modified shape of a computer-aided design model of an object or a partition thereof, a method for assigning the modified shape of an object or the partition thereof to a further object or a partition thereof, a method for producing an object by applying any one of the indicated methods, and a module comprising at least one computer program being adapted for performing at least one step according to any one of the indicated methods.

Such methods are, especially, used in design optimization during product development in various industries, such as in automotive or aerospace industry, medical technology, or product design, in particular, to generate improved designs with regard to mechanical, physical, or aesthetic properties.

RELATED ART

As described in more detail in Daniel Sieger, Stefan Menzel, and Mario Botsch, *Constrained space deformation techniques for design optimization*, Computer-Aided Design, Vol. 72, March 2016, pp. 40-51, design optimization can be considered a key component in a product development process to be applied in the automotive industry and other industries. The overall goal of design optimization is to discover alternative designs which may exhibit improved mechanical, physical or aesthetic properties. Typically, the product development process commences with a generation of an initial prototype, wherein computer-aided design (CAD) tools and models are used.

Subsequent steps are, usually, directed to generating a polygon surface mesh from the CAD model and/or a volumetric simulation mesh in order to be able to evaluate a mechanical and/or physical performance of the generated design, in particular, based on aerodynamics or structural mechanics simulations. Thereafter, variations of the design of the CAD model are generated, especially, based on the mechanical and/or physical performance during the simulations. However, changing a CAD model directly is considered as prohibitive since repeated surface and volume meshing is known to be particularly time-consuming and might even require manual interaction by an expert, especially for complex geometries. Thus, it would be desirous of providing effective means which may be suitable for easily generating alternate designs.

Thus, further according to Sieger et al., shape deformation techniques may be applied in order to adapt both the surface and the volume mesh of the initial design model directly. In this manner, the design optimization may be performable in a fully automatic and parallel manner which is of particular importance when using stochastic optimization techniques, such as evolutionary algorithms, which, typically, require a generation and evaluation of a large number of design variations in order to arrive at a feasible solution. For this purpose, Sieger et al. apply a space deformation technique which is based on moving least squares approximation and which offers the same level of modeling flexibility as surface-based deformations but is independent of the underlying geometry representation and therefore highly robust against defects in input data. Further, it overcomes the scalability limitations of existing space deformation techniques based on globally supported triharmonic radial basis functions while providing the same high level of deformation quality. Finally, geometric constraints, such as preservation of critical feature lines, circular couplings, or planar construction parts, are directly incorporated into the deformation.

Ellen Dekkers, Leif Kobbelt, Richard Pawlicki, Randall C. Smith, *A Sketching Interface for Feature Curve Recovery of Free-Form Surfaces*, Computer-Aided Design, Vol. 43, July 2011, pp. 771-780, a semi-automatic approach to efficiently and robustly recover characteristic feature curves of a given free-form surface is described. Herein, a sketch-based interface is used, wherein a user is required to roughly sketch the location of a feature by drawing a stroke directly on the input mesh. Thereafter, such an initial curve is applied to a correct position based on a graph-cut optimization scheme which takes in to account various surface properties of the object. Herein, feature curves can be used as handles for surface deformation since they describe the main characteristics of an object.

Thomas W. Sederberg and Scott R. Parry, *Free-Form Deformation of Solid Geometric Models*, SIGGRAPH '86 Proceedings of the 13th annual conference on Computer graphics and interactive techniques, ACM SIGGRAPH Computer Graphics, Vol. 20, August 1986, pp. 151-160, describe a method for deforming solid geometric models in a free-form manner based on trivariate Bernstein polynomials which is applicable to deform surface primitives of any type or degree, in particular, planes, quadrics, parametric surface patches, or implicitly defined surfaces. Herein, the deformation can be applied either globally or locally. Local deformations can be imposed with any desired degree of derivative continuity.

Known methods for determining a modified shape of a computer-aided design model of an object or a partition thereof, in general, apply methods which are based on free-form deformation. Examples are found in William M. Hsu, John F. Hughes, and Henry Kaufman, *Direct Manipulation of Free-Form Deformations*, Computer Graphics, Vol. 26, No. 2, July 1992, pp. 177-184; Jean-Philippe Pernot, Stéphane Guillet, Jean-Claude Léon, France Giannini, Chiara Eva Catalano, and Binaca Falcidieno, *A shape deformation tool to model character lines in the early design phases*, SMI '02 Proceedings of the Shape Modeling International 2002 (SMI'02), p. 165; Dominique Bechmann and Dominique Gerber, *Arbitrary shaped deformations with DOGME*, The Visual Computer (2003) Vol. 19, pp. 175-186; and James Gain and Dominique Bechmann, *A Survey of Spatial Deformation from a User-Centered Perspective*, ACM Transactions on Graphics (2008), Vol. 27, No. 4, Article 107.

C. Lorenz and N. Krahnstöver, *Generation of Point-Based 3D Statistical Shape Models for Anatomical Objects*, Computer Vision and Image Understanding 77, 175-191 (2000), describe a method that allows the development of surface point-based three-dimensional statistical shape models. Given a set of medical objects, a statistical shape model can be obtained by principal component analysis. This technique requires that a set of complex shaped objects is represented as a set of vectors that uniquely determines the shapes of the objects and at the same time is suitable for a statistical analysis. The correspondence between the vector components and the respective shape features has to be identical in order for all shape parameter vectors to be considered. An approach to the correspondence problem for arbitrary three-dimensional objects is presented which involves developing a template shape and fitting this template to all objects to be analyzed. The method is applied to obtain a statistical shape model for lumbar vertebrae.

C. Sinthanayothin, W. Bholsithi, and W. Tharanon, *3D Deformable Mesh Aided Dentistry*, https://www.researchgate.net/profile/Chanjira_Sinthanayothin/publication/268043202_3D_Defor mable_Mesh_Aided_Dentistry/links/55e7be2508ae65b638995ee6/3D-Deformable-Mesh-Aided-Dentistry.pdf, describe a 3D deformable mesh which uses a thin-plate spline in the following steps: First, a deformable region is manually defined by locating surface control points. Then, the surface control points are fitted and the patch surface is created automatically by using a cubic-spline technique. Thereafter, the surface control points in the patch surface are manipulated in a direction as required. Then, a manipulation of the surface control points can change the shape of the 3D object using the thin-plate spline algorithm. As a result, the 3D deformable mesh can restrict a deformation to a limited local region or create a new shape by performing large-area deformations. The 3D deformable mesh can perform small deformations in an exiting shape and modify the shape without affecting its original overall characteristics.

The methods based on free-form deformation are, typically, used within existing CAD tools and which offer various transformation methods that allow modifying the shape of an object or a partition thereof in local or a global manner. For this purpose, the known methods, however, use a regular two- or three-dimensional pattern which is applied to the object or the partition thereof in order to represent the corresponding geometry. As a result, linear modifications of the geometry of the object are easily carried out whereas non-linear modifications are limited to existing geometric and/or topologic constraints of the pattern. In particular, adjusting the pattern to the shape of the object appears to be complicated and non-intuitive, especially, for complex shapes. Moreover, locally adjusting a resolution of a modification seems not to be feasible with the known methods.

Problem to be Solved

It is therefore an objective of the present invention to provide a method for determining a modified shape of a computer-aided design model of an object or a partition thereof, a method for assigning the modified shape of an object or the partition thereof to a further object or a partition thereof, a method for producing an object by applying any one of the indicated methods, and a module comprising at least one computer program being adapted for performing at least one step according to any one of the indicated methods in order to overcome the above-mentioned problems and shortcomings of the present state of the art.

It is, particularly, desired that these methods allow an efficient and highly flexible generation of a large number of various designs of a particular object or a particular partition thereof which may comprise improved characteristics with regard to mechanical, physical, aesthetic or other properties of the object.

It is, further, desired that these methods allow locally adjusting a resolution of a modification of the shape of an object, in particular, of a partition thereof.

It is, further, desired that these methods allow an easy transformation of selected forms from one object to another object by assigning proportional data of a particular shape from the object to the other object.

SUMMARY OF THE INVENTION

This problem is solved by a method for determining a modified shape of a computer-aided design model of an object or a partition thereof, a method for assigning the modified shape of the object or the partition thereof to a further object or a partition thereof, a method for producing an object by applying any one of the indicated methods, and a module comprising at least one computer program being adapted for performing at least one step according to any one of the indicated methods with the features of the independent claims. Preferred embodiments, which might be realized in an isolated fashion or in an arbitrary combination, are listed in the dependent claims.

As used in the following, the terms "have", "comprise" or "include" or any arbitrary grammatical variations thereof are used in a non-exclusive way. Thus, these terms may both refer to a situation in which, besides the feature introduced by these terms, no further features are present in the entity described in this context and to a situation in which one or more further features are present. As an example, the expressions "A has B", "A comprises B" and "A includes B" may both refer to a situation in which, besides B, no other element is present in A (i.e. a situation in which A solely and exclusively consists of B) and to a situation in which, besides B, one or more further elements are present in entity A, such as element C, elements C and D or even further elements.

Further, as used in the following, the terms "preferably", "more preferably", "particularly", "more particularly", "specifically", "more specifically" or similar terms are used in conjunction with optional features, without restricting alternative possibilities. Thus, features introduced by these terms are optional features and are not intended to restrict the scope of the claims in any way. The invention may, as the skilled person will recognize, be performed by using alternative features. Similarly, features introduced by "in an embodiment of the invention" or similar expressions are intended to be optional features, without any restriction regarding alternative embodiments of the invention, without any restrictions regarding the scope of the invention and without any restriction regarding the possibility of combining the features introduced in such way with other optional or non-optional features of the invention.

In a first aspect, the present invention relates to a method for determining a modified shape of a computer-aided design model of an object or a partition thereof.

As used herein, the term "object" relates, in general, to an individual physical item which is extended in space and is separable from other objects. Herein, the object has a surface or a boundary that encloses a volume which is taken up by the object. As generally used, the term "shape" refers to the surface which is generated by the object. More particular, the term "object" refers to a product or to a potential product whose shape is being formed during a product development process in accordance with requirements as defined therein. Hereby, the requirements may, in particular, refer to mechanical, physical, and/or aesthetic properties of the object. However, other kinds of requirements may also be applicable. By way of example, the object may be a part of a vehicle, such as a car body shell, a part of a plane, such as a wing, or a medical device, such as a dental prosthesis. However, other kinds of objects may also be feasible for the methods according to the present invention.

Similarly, a "partition" of the object refers to one or more spatial sections of the object which are not separable from other parts of the objects. In particular, the "partition" of the object may, thus, refer to a part of a product which may be considered of having a particular relevance during the product development process. By way of example, the partition of the object may refer to a front, rear or side part of a car body shell, or to a tooth or a dental plate of a dental prosthesis. However, other kinds of partitions may also be conceivable. As further used herein, the term "object" is considered, for sake of simplicity, also to include one or more partitions of the object unless not applicable or otherwise indicated.

As generally used, the term "computer-aided design model" or "CAD model" relates to a copy of the object in form of a two- or three-dimensional graphical representation which is applicable in a computer-aided design program, usually, abbreviated to a "CAD program". Herein, the CAD program is configured for being used for receiving, modifying, and outputting at least one graphical representation related to the object. In order to obtain a suitable graphical representation of the object, the CAD program, usually, applies a graphical approximation of the shape of the object since the shape of the object, in general, deviates from a simple numerical representation.

For this purpose, the CAD model may employ a known a graphical approximation scheme, such as a polygon surface mesh a volumetric simulation mesh. However, other kinds of graphical approximation schemes may also be applicable with the CAD model.

As further used herein, the term "modified shape" refers to a secondary shape of an object which may be determined by a modification of the shape of the object, in particular, by applying the corresponding method according to the present invention. For sake of improved distinction, the shape of the object prior to the modification of the object may also be denoted by the phrase "original shape". Consequently, the modified shape of the object, in general, deviates from the original shape of the object in at least one regard, preferably, by at least one item of the graphical representation of the object, such as by at least one coordinate of the surface on a plane or in the space.

The method for determining a modified shape of a computer-aided design model of an object or a partition thereof according to the present invention comprises at least the following steps (a) to step (d), wherein, however, additional steps may further be performed. Preferably, the method steps (a) to (d) may be performed in the given order, commencing with step (a), continuing with steps (b), and (c) in this order, and finishing with step (d), wherein, however, a subsequent step may partially be performed concurrently with a previous step. Thus, the method for determining a modified shape of a computer-aided design model of an object or a partition thereof comprises at least the following steps:

(a) placing at least two reference landmarks at a reference position with respect to a shape of an object or to a partition thereof;
(b) placing an adjustment landmark at the reference position of the corresponding reference landmark;
(c) displacing any or all of the adjustment landmarks from the reference position to a modified position, whereby a displacement between the modified position and the reference position is obtained; and
(d) generating the modified shape of the object or the partition thereof by modifying the shape of the object or the partition thereof by applying a homogeneous function of the displacement to the CAD model of the shape of the object or the partition thereof.

According to step (a), at least two reference landmarks are placed at a reference position with respect to a shape of an object or to a partition thereof. As generally used, the term "landmark" refers to a point which is placed at a location where it may function as a remarkable feature which is capable of being used for at least one further purpose, in particular, for a reference, an orientation or a navigation purpose. The term "landmark" is known to have previously been used in the field of functional biology, in particular, with regard to quantitatively analyzing morphologic and/or biomechanical properties of living organisms or organs and to determine individual differentiations between related living organisms and/or organs. Reference may be made to Bookstein F. L., *Principal warps: Thin-plate splines and the decomposition of deformations*, Pattern Analysis and Machine Intelligence, IEEE Transactions, Vol. 11, No. 6, 2002, pp. 567-585, and references therein for utilizing landmark information to calculate harmonic warp transformation.

Since the landmarks which are placed during to step (a) are used for further reference, they are denoted "reference landmarks" and the respective location where each of them is placed is denominated as "reference position". Further, a collectivity of the at least two reference landmarks may also be considered as a set of reference landmarks. As used according to the present invention, the reference landmarks appear to function as anchoring points since they are firmly attached to a geometrical property of the shape of the object. As a result, they can, furthermore, be used to fix particularly selected sections of the object in order to reduce an impact of deformations on the particularly selected sections of the object.

Herein, at least two reference landmarks, preferably a plurality of reference landmarks, are used, wherein a number of the reference landmarks and a distribution of the reference landmarks over of the shape of the object or the partition thereof may be selected in accordance with at least one selected parameter, in particular, a size of the object to be modified, a complexity of the shape of the object, a complexity of the envisaged modification of the shape, or a resolution of the shape of the object which is desired at the reference positions where the reference landmarks are placed. However, one or more further parameters may, alternatively or in addition, be taken into account. As used herein, the term "resolution of the shape" refers to a grade of accuracy by which the shape is represented in the graphical representation of the object in form of the CAD model. As a result, a high resolution of the shape of the object may, generally, be accompanied by a close relative distance between adjacent reference landmarks whereas a low resolution of the shape of the object may, generally, be accompanied by a large relative distance between adjacent reference landmarks. Consequently, by placing the landmarks it may, thus, be feasible to adjust the resolution of the shape either globally or, preferably, locally, wherein a local adjustment of the resolution of the shape may allow emphasizing relevant portions of the shape and lessening other portions of the shape.

In a particular embodiment, a weight may, additionally, be assigned to each of the reference landmarks, wherein the weight may, preferably, be selected according to an accuracy by which the shape of the object may be known and/or modified at the reference position of each of the reference landmarks. As described later in more detail, the respective weight may, further, be used in step (d) in generating the modified shape of the object by applying it to the homogeneous function of the displacement which is applied to the CAD model of the shape of the object for modification.

As already indicated above, the term "reference position" relates to the location of the corresponding reference landmark. In accordance with the present invention, each reference landmark may be placed at an arbitrary point with regard to the shape of the object, such as by manually placing one or more reference landmarks to desired positions in the CAD model of the object. Herein, the passage "with regard to the shape" refers to a location on the surface of the object or, alternatively, to a location which is close to the surface of the object. As used herein, the term "close to the surface" relates to a reference landmark which is not placed at or on the surface of the CAD model of the shape of the object but located on a logical construction frame applied to the object. As generally used, the term "logic construction frame" refers to a construction frame, which may be configured in order to provide an additional structure to the CAD model. Hereby, the additional structure may be construed in order to facilitate the construction of the object by providing at least one simplified reference line or plane which may provide orientation for generating the surface of the object. In particular, the logic construction frame may be used for simplifying the geometric appearance of an object. By way of example, the logic construction frame can be applied to reduce an influence of rounded corners by providing a geometric approximation which may at least partially disregard the rounded corners.

In a further preferred embodiment, at least one of the reference landmarks may, alternatively, be located on a distinguished point with regard to the shape of the object. In this embodiment, the distinguished point may, preferably, be or comprise a point which may be located on or at a reference geometry which may be adapted to approximate the shape of object. As generally used, the term "reference geometry" relates to at least one geometric object, in particular, to polynomic curves and/or surfaces, especially, to one or more lines and/or planes, which may be selected in order to approximate the CAD model of the surface of the object. For this purpose, the reference geometry can be determined by applying a semi-automatic registration of the distinguished point, in particular, by employing a nearest-neighbor determination or a closest-point-to-object determination to the CAD model of the shape of the object.

In a further preferred embodiment, at least one of the reference landmarks may, alternatively, be selected from a determined point with regard to the shape of the object, wherein the determined point may refer to a minimum or a maximum of the shape of the object or of a derivative thereof at the location of the determined point, especially, by using an automatic registration of one or more determined points. In particular, the determined point may, thus, refer to a curvature point or an inflection point of the shape of the object. As generally used, the term "curvature point" relates to a point at the surface of the object at which the sign of the first derivative of the shape changes from a positive value to a negative value or vice-versa while the term "inflection point" refers to a point at the surface of the object at which the sign of the second derivative changes from a positive value to a negative value or vice-versa.

In a particular embodiment, at least one further reference landmark may be placed with respect to at least one existing reference landmark, such as with respect to one or more existing reference landmarks. For this purpose, the location where the further reference landmark may be placed during step (a) can be determined by using a nearest-neighbor determination or a closest-point-to-object determination, for which determination the at least one existing reference landmark may be taken into account.

According to step (b) an adjustment landmark is placed at the reference position of the corresponding reference landmark. In a particularly preferred embodiment, exactly one adjustment landmark may, thus, be placed at each of the reference positions of the corresponding reference landmark. As a result, the number of adjustment landmarks equals the number of reference landmarks. However, in an alternative embodiment, no adjustment landmark may be placed at selected reference positions, in particular, at such selected reference positions which may be known not to be displaced during step (c). With regard to the term "landmark", reference may be made to the definition of this term above. Similar to the set of reference landmarks, a collectivity of the, thus, at least two adjustment landmarks may, analogously, be considered as a set of adjustment landmarks, wherein both the set of reference landmarks and the set of adjustment landmarks may, in the particularly preferred embodiment as described above, comprise the same number of entities. Herein, step (b) may, preferably, be performed either by converting a reference landmark into an adjustment landmark or, alternatively, by registering a set of adjustment landmarks. In a particularly preferred embodiment, a reference geometry which has been supplied during step (a) can, similarly, be converted into an adjustment geometry.

According to step (c), any or all of the adjustment landmarks are displaced from the reference position where they had been placed in accordance with step (b) to a modified position. As a result, a displacement between the modified position and the reference position is generated hereby. Herein, the number of adjustment landmarks which are displaced from the reference position to the modified position depends on whether a deformation of the object may be desired at the reference position of the reference landmark or not. Thus, only those adjustment landmarks are displaced at whose position the shape of the object may be desired to be modified. Further, a distance of the displacement between the modified position and the reference position may, preferably, be selected according to a grade of deformation of the object which is desired at the reference position of the reference landmark. Consequently, a large deformation may be achieved by performing a large displacement of the adjustment landmark with respect to the reference landmark whereas a small deformation may be obtained when a small displacement of the adjustment landmark with respect to the reference landmark is performed.

According to step (d), the modified shape of the object is generated by modifying the shape of the object by applying a homogeneous function of the displacement to the CAD model of the shape of the object. As already defined above, the term "modified shape" refers to a secondary shape of the object being determined by modifying the shape of the object, in particular, by applying the corresponding method according to the present invention. For this purpose, a homogeneous function of the displacement is applied to the CAD model of the shape of the object. As used herein, the term "function of the displacement" refers to a function having parameters, wherein the function may be applied to the graphical representation of the shape in form of the CAD model and wherein the parameters of the function comprise the displacement values of the adjustment landmarks with respect to the reference landmarks, wherein, further, the term "homogeneous" relates to a property of the function which allows determining displacements of arbitrary points which are located at or on the shape of the object but between at least two reference landmarks. In this manner, the application of the homogeneous function of the displacement to the shape of the object may allow modifying the shape of the object at each and every arbitrary point located at or on the shape of the object, whereby the modified shape of the object is obtained.

In a particularly preferred embodiment, modifying the shape of the object may, therefore, comprise applying a curve transformation or a plate transformation to the CAD model of the shape of the object. As generally used, the term "curve transformation" refers to a particular kind of homogeneous function which may affect a modification of the shape along a homogeneous curve that can be laid between at least two of the adjustment landmarks. Similarly, the term "plate transformation" relates to a further particular kind of homogeneous function which may affect a modification of the shape in accordance with a plane that can be provided by at least three of the adjustment landmarks. In this regard, a thin-plate transformation may, especially, be applied to the shape of the object in order to modify its shape. However, other kinds of homogeneous functions may also be applicable during step (d) in order to obtain the modified shape of the object. As generally used, "thin-plate warp transformation" are methods used for simulate warping of thin-plate materials through displacement of landmark points. While original utilized to describe two-dimensional deformations, a three-dimensional implementation of this method can be used to calculate harmonic deformations of a variety of three-dimensional geometric object types as curves, surfaces or polygonal meshes utilizing three-dimensional displacement of landmarks.

In the further preferred embodiment as described above according to which at least one of the landmark points may, preferably, be located on or at a reference geometry that may be adapted to approximate the shape of object, it may be advantageous during step (d) to determine a modified reference geometry by modifying the original reference geometry as desired. In order to actually obtain the modified reference geometry, the homogeneous approximation function which has, preferably, been used for determining the original reference geometry may also be applied for this purpose. Further, the modified reference geometry may, eventually, be used for (re-)constructing the CAD model of the modified shape of the object by applying the homogeneous approximation function to the CAD model of the modified shape of the object.

As described above, a weight may, additionally, be assigned to each of the reference landmarks, wherein the weight may, preferably, be selected according to an accuracy by which the shape of the object may be known at the reference position of each of the reference landmarks. As a result, the respective weights may be used during step (d) in generating the modified shape of the object by applying it to the homogeneous function of the displacement which is used to modify the CAD model of the shape of the object. Depending on the respective weight which is assigned to the reference landmarks, it may be possible to adjust on a local scale how much effect the homogeneous function can exert on the modification of the shape of the object. By way of example, a first reference landmark having a low respective weight may, thus, modify the shape to a lesser extent compared to a second reference landmark having a higher respective weight.

As a result, the present method for determining a modified shape of a computer-aided design model of an object uses a point-based global transformation process which allows both linear and non-linear transformations without being limited by geometric or topological constraints imposed by using a two- or three-dimensional pattern as described above. In the point-based global transformation process, a set of reference landmarks which can be placed arbitrarily without being required to apply any reference to a pattern is applied accordance with step (a). Without such kinds of limitations, the reference landmarks can, especially, be placed, preferably strategically placed, with regard to the shape of the object in the CAD model thereof. In addition, placing the adjustment landmarks according to step (b) and displacing them pursuant to step (c) allows uniformly modifying the shape of the object by applying to step (d).

Consequently, the point-based global transformation process according to the present invention allows performing a flexible, complex, topological transformation process of a high-resolution geometry by applying a comparatively low number of landmarks which are used as control elements. This process is expected to suitably fit into transformation processes in product development which, typically, alternates between analogously or digitally performable method steps, including manipulating scan data, 3D printing processes and/or milling procedures, in in various industries, in particular, in the automotive or aerospace industry, in medical technology, or general product design.

In a further aspect, the present invention relates to a method for assigning the modified shape of the object or the partition thereof to at least one further object or a partition thereof. For this purpose, the method for determining a modified shape of a CAD model of an object is applied to a CAD model of a particular object, whereby the displacement of the shape of the CAD model of the particular object is obtained. Herein, the displacement of the shape of the CAD model of the particular object is used to determine at least one characteristic value which is related to the displacement of the shape of the CAD model of the particular object. As generally used, the term "characteristic value" refers to one or more numbers which may be used for characterizing complex facts, such as the shape of an object or a class of objects.

In this manner, it may be possible to quantify characteristic information related to the shape of the object, in particular, of proportions related to the shape of the object. Thus, the at least one characteristic value may process the modifications between the reference landmarks and the adjustment landmarks to which it may be connected to for further reference. Subsequently, the at least one characteristic value is applied to the shape of a CAD model of at least one further object in order to modify the at least one further object in a manner which is related to the particular object. Prior to applying the at least one characteristic value to the shape of the CAD model of the at least one further object, the characteristic value can, preferably, be stored in a database, in particular, for further reference, especially, for an automatic generation of a series or a class of modified shapes configured of at least one further object. Herein, the further object may, preferably, be an object which may be similar to the particular object, wherein the similar object may belong to the same or to a related product line. By way of example, at least one characteristic value may be generated from a particular design of a car body shell and, subsequently, be applied to a vehicle range which may, thus, exhibit similar proportions as the particular design of the template car body shell. Further applications of the at least one characteristic value may include a determination of ageing processes as well as analyses and estimates about future product development.

In a further aspect, the present invention relates to a method for producing an object by applying any one of the above-indicated methods. Herein, the method for producing an object comprises at least the following steps (i) to step (iii), wherein, however, additional steps may further be performed. Preferably, the method steps (i) to (iii) may be performed in the given order, commencing with step (i), continuing with step (ii), and finishing with step (iii), wherein, however, a subsequent step may partially be performed concurrently with a previous step. Thus, the method for producing an object comprises at least the following steps:
(i) generating a CAD model of the object;
(ii) determining a modified shape of the CAD model of the object as described elsewhere herein; and
(iii) producing the object by applying information with respect to the modified shape.

For further information about generating a CAD model of an object according to step (i) as well as for determining a modified shape thereof pursuant to step (ii), reference may be made to the description elsewhere in this document. With regard to step (iii), the object is produced by employing the information with regard to the modified shape thereof, in particular, by applying at least one generation procedure, particularly, selected from:
an additive prototyping and/or manufacturing process, preferably 3D-printing; and/or
a subtractive prototyping and/or manufacturing process, preferably milling or etching; and/or
virtual prototyping, in particular virtual reality or augmented reality visualizations.

In particular, the methods according to the present invention as disclosed here are computer-implemented methods. As generally used, the term "computer-implemented" indicates that performing the method involves using a processing module, such as a processing module as comprised in a computer, in a computer-assisted system, in a computer network, or in another programmable apparatus, whereby any or all features of the method steps may be performed by employing a computer program being adapted for a use in the processing module. For the purpose of the present invention, the processing module may, preferably, be comprised as an additional CAD tool in a CAD system. Specifically, the computer program may be stored on a computer-readable data carrier. Thus, specifically, one, more than one or even all of the method steps as indicated above may be performed by using a computer or a computer network, preferably by using a computer program. Thus, in a further aspect, the present invention relates to a module which comprises at least one computer program being adapted for performing at least one step according to any one of the indicated methods.

SHORT DESCRIPTION OF THE FIGURES

Further optional features and embodiments of the invention will be disclosed in more detail in the subsequent description of preferred embodiments, preferably in conjunction with the dependent claims. Therein, the respective optional features may be realized in an isolated fashion as well as in any arbitrary feasible combination, as the skilled person will realize. The scope of the invention is not restricted by the preferred embodiments. The embodiments are schematically depicted in the Figures. Therein, identical reference numbers in these Figures refer to identical or functionally comparable elements.

In the Figures:
FIGS. 1A to 1D schematically illustrate the steps of the method for determining a modified shape of a CAD model of a car door according to a first embodiment; and
FIGS. 2A to 2E schematically illustrate the steps of the method for determining a modified shape of a CAD model of a car door according to a second embodiment.

DETAILED DESCRIPTION OF THE EMBODIMENTS

As a starting point, FIG. 1A schematically illustrates a CAD model 110 of a shape 112 of an object 114 in the form of a car door 116. As will be explained below with regard to FIG. 1D, this shape 112 of the car door 116 may also be denoted as the "original shape" of the car door 116 which is subject to a modification pursuant to the present invention. For the purpose of a graphical representation 118 of the car door 116, the CAD model 110 is exemplarily defined here by a polygon surface mesh 120. However, other kinds of graphical representation 118 may also be feasible.

Figure 1B:
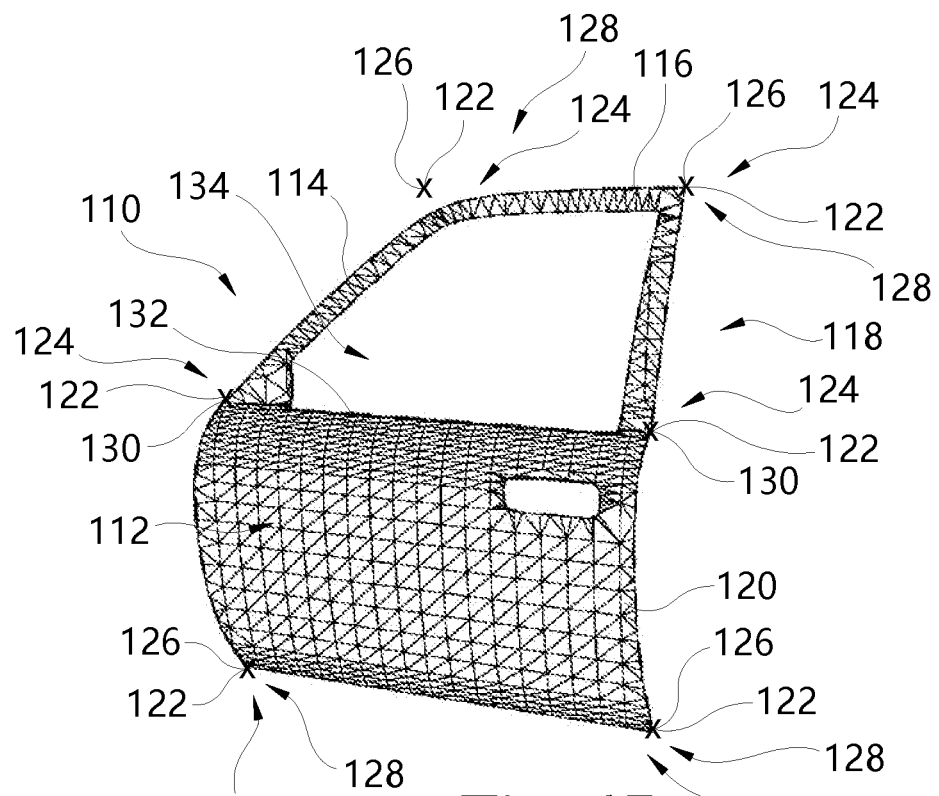

As illustrated in FIG. 1B, a number of reference landmarks 122 are placed, according to step (a), at a corresponding reference position 124 for each of the reference landmarks 122. Herein, the number of the reference landmarks 122 and their distribution over the shape 112 of the object 114 may be selected in accordance with a size of the object 114, a complexity of the shape 112 of the object 114, a complexity of the envisaged modification of the shape 112, or a resolution of the shape 112 of the object 114 which is desired at the reference positions 124 of the reference landmarks 122. In the exemplary embodiment of the car door 116 as illustrated in FIG. 1B, the resolution of the shape 112 has been selected almost equally for all partitions of the car door 116 such that the reference landmarks 122 have been distributed virtually equally over the shape 112 of the car door 116. However, other manners of distributing the reference landmarks 122 may also be feasible.

In the embodiment of FIG. 1B, each of the reference landmarks 122 have been placed directly at or on the shape 112 of the car door 116 or close to the shape 112 of the car door 116. As exemplary depicted in FIG. 1B, the top left reference landmark 122 has been placed close to the shape 112 of the car door 116 by locating it on a logical construction frame applied to the car door 116, wherein the logic construction frame refers to an additional structure provided to the CAD model 110 in a manner to facilitate the construction of the object 110 by providing at least one simplified reference line or plane configured for providing orientation in generating the shape 112 of the car door 116 in the CAD model 110, especially, in order to reduce an influence of a rounded corner of the car door 116 at the position of the top left reference landmark 122.

Further, some of the reference landmarks 122 have been placed at determined points 126, with regard to the shape 112 of the car door 116. As defined above, the term "determined point" refers to a minimum or a maximum of the shape 112 of the car door 116 or of a derivative thereof at the location of the determined point 126. As schematically illustrated in FIG. 1B, all of the determined points 126 relate to a local maximum at rounded corners 128 of the car door 116.

Further, others of the reference landmarks 122 have been placed at distinguished points 130 with regard to the shape 112 of the car door 116. As further schematically illustrated in FIG. 1B, each of the distinguished points 130 refers here to a point at located on an extension of a boundary line 132 of a reference geometry opening 134 in the car door 116, wherein the particular opening 134 in the car door 116 is designed for receiving a window. As a result, the distinguished points 130 are located at respective extensions of the boundary line 132 in this exemplary embodiment.

Figure 1C:
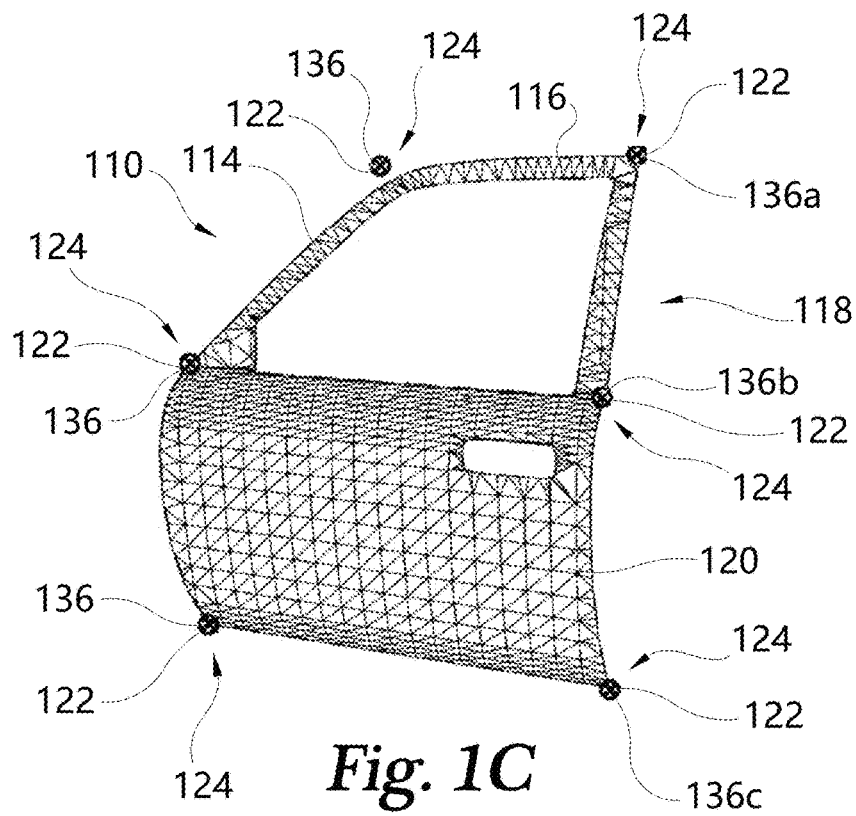

As schematically illustrated in FIG. 1C, exactly one adjustment landmark 136 is placed according to step (b) at each reference position 124 of the corresponding reference landmark 122. Herein, step (b) may be performed either by converting a corresponding reference landmark 122 into an adjustment landmark 136 or, alternatively, by registering an additional set of adjustment landmarks 136.

Figure 1D:
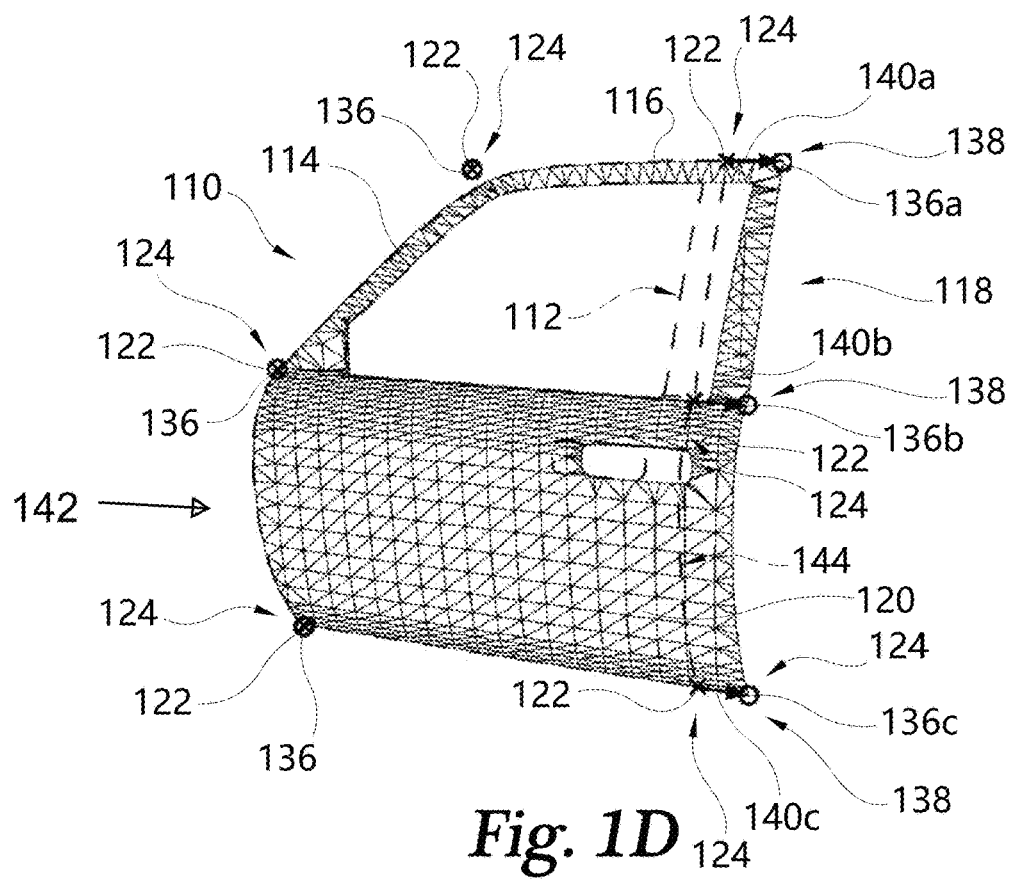

As schematically illustrated in FIG. 1D, the adjustment landmarks 136a, 136b, and 136c which are located on the right side of the car door 116 are displaced according to step (c) from the reference position 124 where they had been placed in FIG. 1B in accordance with step (b) to a modified position 138. As a result, displacements 140a, 140b, and 140c between the modified position 138 and the reference position 124 of the actually displaced adjustment landmarks 136a, 136b, and 136c are generated. In contrast hereto, the adjustment landmarks 136 which are located on the left side of the car door 116 are not displaced such that they remain together with the reference landmarks 122 on the reference position 124.

As a result, only those adjustment landmarks 136a, 136b, and 136c are displaced from their reference position 124 to the modified position 138 if a deformation of the car door 116 is desired at the reference position 124 of the reference landmark 122. Further, a large deformation of the shape 112 of the car door 116 has been obtained at the right side of the car door 116 by performing large displacements 140a, 140b, and 140c of the corresponding adjustment landmarks 136a, 136b, and 136c with regard to the respective reference landmarks 122 whereas no deformation of the shape 112 of the car door 116 can be observed on the left side of the car door 116 since the corresponding adjustment landmarks 136 still coincide here with the respective reference landmarks 122.

Consequently, FIG. 1D schematically shows that a partition of the original shape 112 of the car door 116 which is illustrated by dashed lines has been modified during step (d) in order to indicate that the car door 116 now assumes a modified shape 142 as desired. In order to actually obtain the CAD model 110 of the modified shape 142, the CAD model 110 of the original shape 112 of the car door 116 has been modified by applying a homogeneous function of the displacements 140a, 140b, and 140c to the original shape 112 of the car door 116. As can be derived from FIG. 1D, a homogeneous curve 144 has been applied as a particular kind of homogeneous function in this exemplary embodiment in order to affect the modification of the original shape 112 of the car door 116. More particular, the homogeneous curve 144 which had been laid between the three adjustment landmarks 136a, 136b, and 136c on the right side of the door 116 in FIG. 1C has been displaced together with the three corresponding adjustment landmarks 136a, 136b, and 136c during steps (c) and (d), whereby the right side of the original shape 112 of the door 116 has been, correspondingly, modified in order to arrive at the modified shape 142 of the car door 116. Using the homogeneous curve 144, thus, allows determining the displacements 140a, 140b, and 140c of the car door 116 at arbitrary points located at or on the shape 112 of the car door 116 but between the three corresponding adjustment landmarks 136a, 136b, and 136c. In this manner, the application of the homogeneous curve 144 to the displacements 140a, 140b, and 140c of the original shape 112 of the car door 116 results in obtaining the CAD model 110 of the modified shape 142 of the car door 116 at each and every arbitrary point located at or on the shape 112 of the car door 116.

FIGS. 2A to 2E illustrate a further, particularly preferred embodiment for the method for determining the modified shape 242 of the CAD model 210 of the car door 216.

Figure 2A:
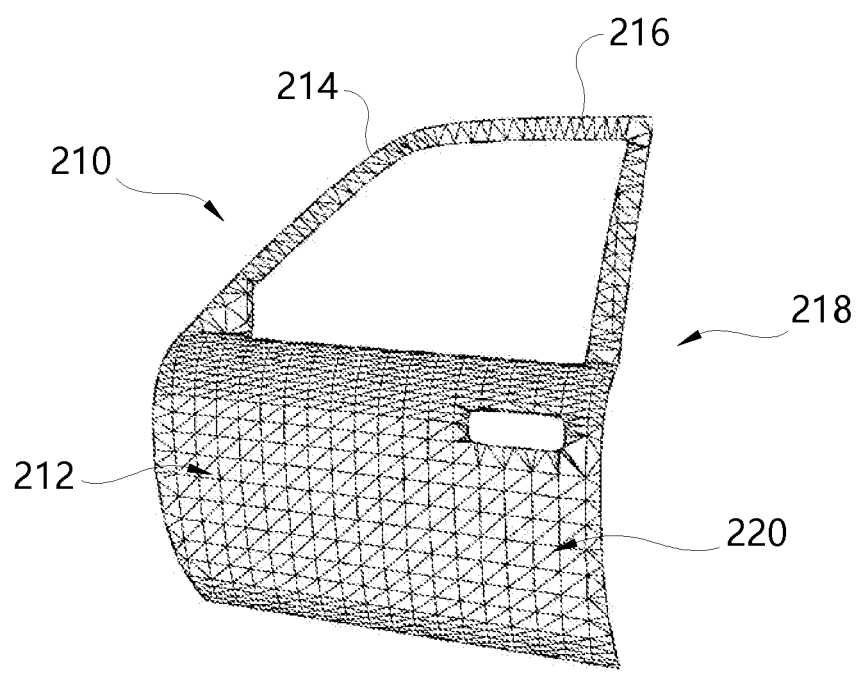

Herein, FIG. 2A which schematically illustrates the CAD model 210 of the original shape 212 of the object 214 in form of the car door 216, wherein the graphical representation 218 of the car door 216 is exemplarily defined by a polygon surface mesh 220, is identical with the illustration of FIG. 1A.

Figure 2B:
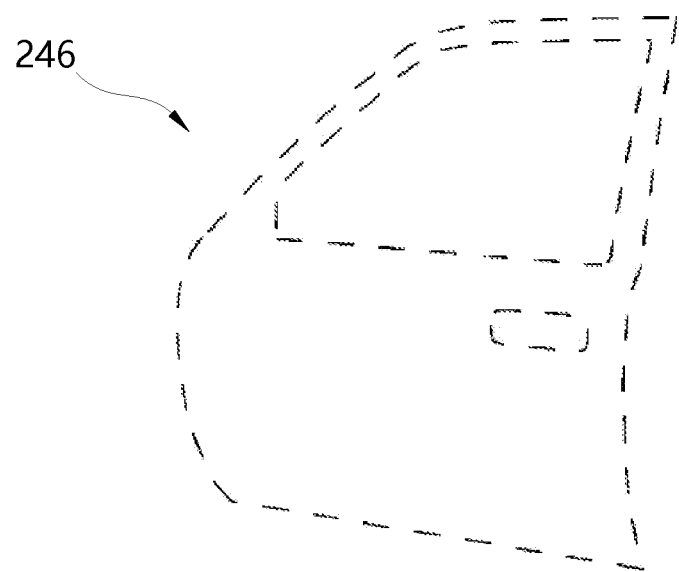

FIG. 2B schematically shows a reference geometry 246 which is adapted to approximate the shape 212 of the car door 216 in the CAD model 210 thereof as depicted in FIG. 2A. Similar to the term "original shape" of the car door 216, the reference geometry 246 which is related to the original shape of the car door 216 can also be denoted here by the phrase "original reference geometry". Herein, the reference geometry 246 may, preferably, be obtained by applying a homogeneous approximation function to the original shape 212 of the car door.

Figure 2C:
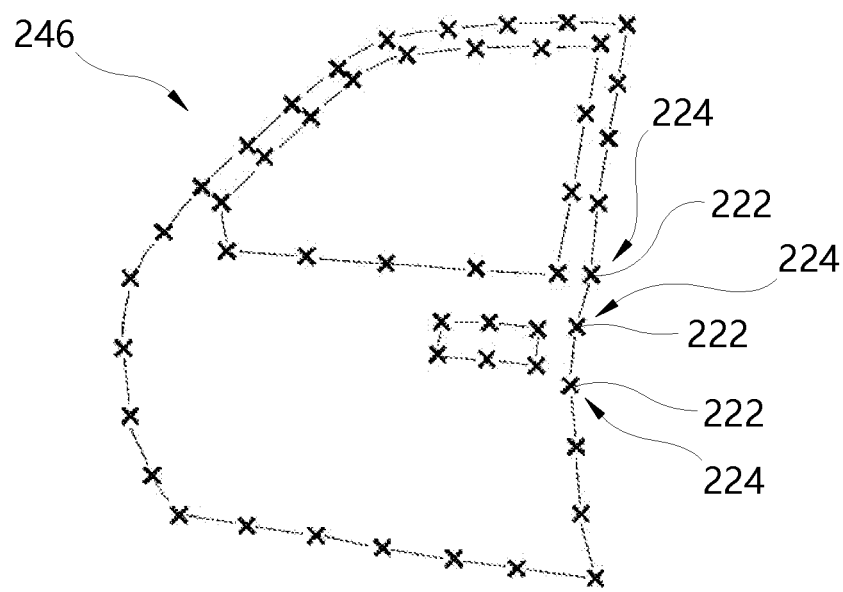

As schematically illustrated in FIG. 2C, the number of reference landmarks 222 are placed, according to step (a), at the corresponding reference positions 224 for each of the reference landmarks 222 on the reference geometry 246. Also in the exemplary embodiment of the car door 216 of FIG. 2C, the resolution of the shape 212 has been selected almost equally for all partitions of the car door 216 by distributing the reference landmarks 222 virtually equally over the shape 212 of the car door 216. However, other manners of distributing the reference landmarks 222 over the car door 216 may also be feasible.

Figure 2D:
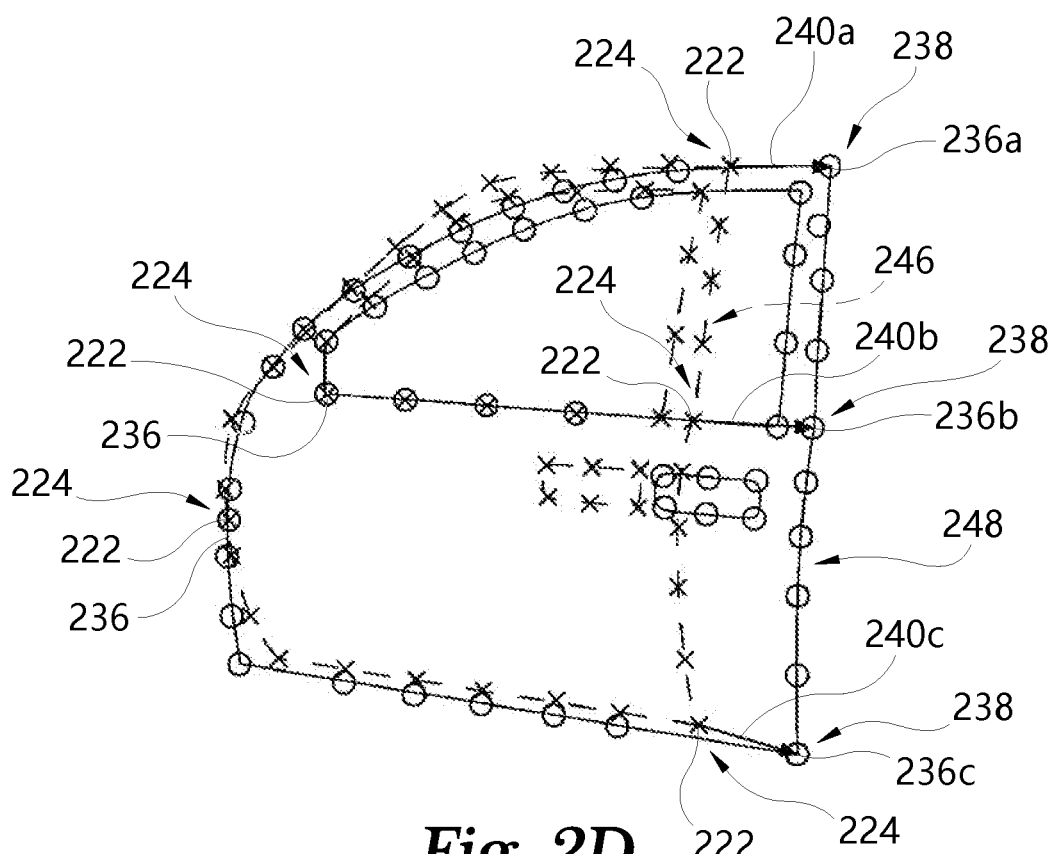

FIG. 2D depicts, subsequently, placing exactly one adjustment landmark 236 at the reference position 224 of the corresponding reference landmark 222 according to step (b) and displacing the adjustment landmarks 236a, 236b, and 236c from the reference position 224 to a modified position 238 according to step (c). Hereby, the respective displacements 240a, 240b, and 240c between the modified position 238 and the reference position 224 for each adjustment landmark 236a, 236b, and 236c are obtained.

Further, FIG. 2D schematically illustrates, by dashed lines, the original reference geometry 246 approximating the original shape 212 of the car door 216 in the CAD model 210 thereof and, in addition, by solid lines, a modified reference geometry 248 which has been obtained during step (d) by modifying the original reference geometry 246 as desired. In order to actually obtain the modified reference geometry 148, the homogeneous approximation function which has, preferably, been used for determining the original reference geometry 246 may be applied for this purpose, thus, opening an even easier way to modification compared to FIG. 1D.

Figure 2E:
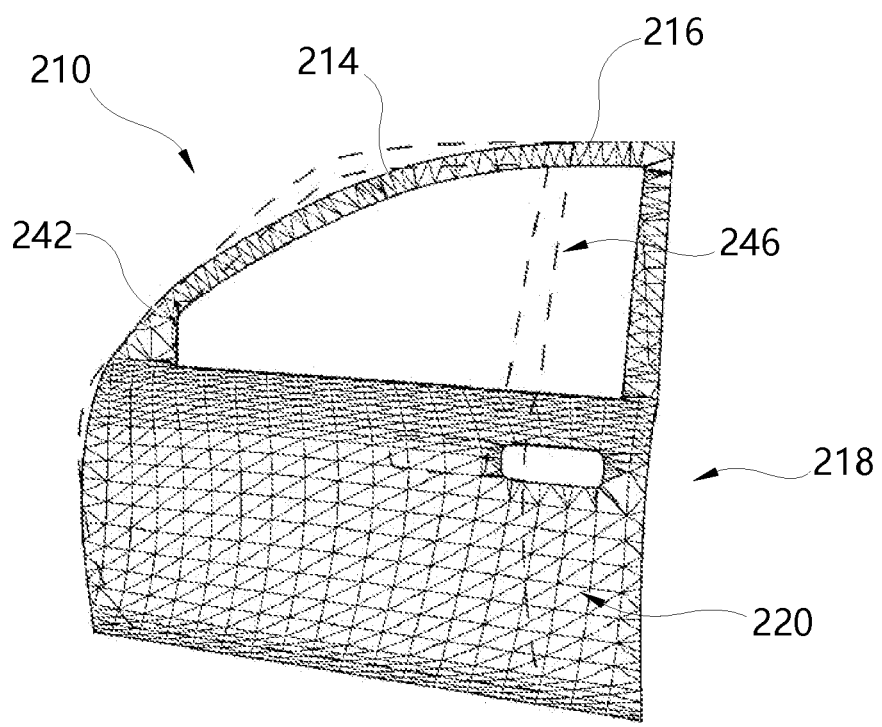

As displayed in FIG. 2E, the modified reference geometry 248 may, finally, be used for (re-) constructing the CAD model 210 of the modified shape 242 of the car door 216 by applying the homogeneous approximation function to the CAD model 210 of the modified shape 242 of the car door 216.

LIST OF REFERENCE SIGNS 110 computer-aided design (CAD) model
112 (original) shape
114 object
116 car door
118 graphical representation 120 polygon surface mesh
122 reference landmark
124 reference position
126 determined point
128 rounded corner
130 distinguished point
132 boundary line
134 opening
136 adjustment landmark
136a adjustment landmark
136b adjustment landmark
136c adjustment landmark
138 modified position
140a displacement
140b displacement
140c displacement
142 modified shape
144 homogeneous curve
146 reference geometry
148 modified reference geometry
210 computer-aided design (CAD) model
212 (original) shape
214 object
216 car door
218 graphical representation
220 polygon surface mesh
222 reference landmark
224 reference position
236 adjustment landmark
236a adjustment landmark
236b adjustment landmark
236c adjustment landmark
238 modified position
240a displacement
240b displacement
240c displacement
242 modified shape
246 reference geometry
248 modified reference geometry

We claim:

1. A method for determining a modified shape of a computer-aided design model of an object or a partition thereof and producing a physical object embodying a modified object, comprising:
 (i) generating a computer-aided design model of the object;
 (ii) determining the modified shape of the computer-aided design model of the object or the partition thereof, wherein the determining the modified shape includes
  (a) placing at least first, second, and third reference landmarks at corresponding first, second, and third reference positions with respect to a shape of the object or to the partition thereof, wherein the shape is an irregular three-dimensional shape, wherein said placing includes placing the first, second, and third reference landmarks arbitrarily without a reference to a three-dimensional pattern along the irregular three-dimensional shape,
  (b) placing an adjustment landmark at the first reference position of the first reference landmark,
  (c) designating the second reference position of the second reference landmark as an anchoring point,
  (d) displacing the adjustment landmark from the first reference position to a modified position, whereby a displacement between the modified position and the first reference position is obtained, and
  (e) generating the modified shape of the object or the partition thereof by modifying the shape of the object or the partition thereof by applying a homogeneous function of the displacement to the computer-aided design model of the shape of the object or the partition thereof, wherein the generating the modified shape includes deforming a section of the object at the anchoring point and reducing an impact of deformation at the section of the object at the anchoring point; and
 (iii) producing the physical object embodying the modified object by applying information with respect to the modified shape.

2. The method of claim 1, wherein each reference landmark is placed as one of:
 an arbitrary point with regard to the shape of the object or the partition thereof;
 a distinguished point with regard to the shape of the object or the partition thereof, wherein the distinguished point refers to a particular point on the shape of the object or the partition thereof, or
 a determined point with regard to the shape of the object or the partition thereof, wherein the determined point refers to one of: a minimum or a maximum of the shape of the object or the partition thereof or of a derivative thereof.

3. The method of claim 2, wherein the distinguished point refers to a point on a reference geometry approximating the shape of the object or the partition thereof.

4. The method of claim 3, wherein for determining the reference geometry at least one of the following is applied: a nearest-neighbor determination or a closest-point-to-object determination.

5. The method of claim 2, wherein the determined point refers to at least one of: a curvature point or an inflection point on the shape of the object or the partition thereof.

6. The method of claim 1, wherein at least one further reference landmark is placed with respect to at least one existing reference landmark.

7. The method of claim 1, wherein a density of the reference landmarks with respect to the shape of the object or the partition thereof is selected according to a resolution of the shape of the object or the partition thereof which is desired at the reference positions, wherein the resolution is a measure of relative distance between adjacent reference landmarks, and wherein a higher resolution of the shape has the adjacent reference landmarks closer together as compared to a lower resolution of the shape.

8. The method of claim 1, wherein a weight is assigned to any or all of the reference landmarks, wherein the weight is selected according to an accuracy by which the shape the object or the partition thereof is known and/or modified at the reference position to which the weight is assigned, and wherein the weight is used during step (d) by applying it to the homogeneous function of the displacement, wherein the accuracy represents a proximity of measurement of the reference position to an actual position of the object.

9. The method of claim 1, wherein a distance of the displacement corresponds to a degree of deformation of the object or the partition thereof which is desired at the reference position.

10. The method of claim 1, wherein modifying the shape of the object or the partition thereof comprises applying a curve transformation or a plate transformation to the shape of the object or the partition thereof.

11. The method of claim 10, wherein modifying the shape of the object or the partition thereof comprises applying a thin-plate transformation to the shape of the object or the partition thereof.

12. A method for assigning the modified shape of the object or the partition thereof to at least one further object or a partition thereof, wherein the method comprises applying the steps of claim 1 to a computer-aided design model of the object or the partition thereof, wherein at least one characteristic value which is related to the displacement of the shape of the computer-aided design model of the object or the partition thereof is determined and, subsequently, applied to the shape of the computer-aided design model of the further object or the partition thereof.

13. The method of claim 12, wherein the at least one characteristic value is stored in a database prior to applying it to the shape of the computer-aided design model of the further object or the partition thereof.

14. A method for producing a further modified object, comprising the following steps:
 (i) generating a computer-aided design model of a modified object;
 (ii) determining a further modified shape of the computer-aided design model of the object or a partition thereof, wherein the method comprises applying the steps of claim 12;
 (iii) producing the further modified object by applying information with respect to the further modified shape.

15. The method of claim 1, wherein said generating the modified shape includes allowing both linear and non-linear transformations without being limited by geometric or topological constraints imposed by using the three-dimensional pattern.

16. The method of claim 1, wherein said generating the modified shape includes performing a non-linear modification to the computer-aided design model of the object without being limited to topological constraints of the three-dimensional pattern.

17. A method for determining a modified shape of a computer-aided design model of an object or a partition thereof and producing a physical object embodying a modified object, comprising:
 (i) generating a computer-aided design model of the object;
 (ii) determining the modified shape of the computer-aided design model of the object or the partition thereof, wherein the determining the modified shape includes
  (a) placing at least first, second, and third reference landmarks at corresponding first, second, and third reference positions with respect to a shape of the object or to the partition thereof, wherein the shape is an irregular three-dimensional shape, wherein said placing includes placing the first, second, and third reference landmarks arbitrarily without a reference to a three-dimensional pattern along the irregular three-dimensional shape,
  (b) placing an adjustment landmark at the first reference position of the first reference landmark,
  (c) designating the second reference position of the second reference landmark and the third reference position of the third reference landmark as anchoring points,
  (d) displacing the adjustment landmark from the first reference position to a modified position, whereby a displacement between the modified position and the first reference position is obtained, and
  (e) generating the modified shape of the object or the partition thereof by modifying the shape of the object or the partition thereof by applying a homogeneous function of the displacement to the computer-aided design model of the shape of the object or the partition thereof, wherein the generating the modified shape includes deforming a section of the object at the first reference point and reducing an impact of deformation at the section of the object at the anchoring points at the second and third reference positions, wherein said generating the modified shape includes performing a non-linear modification to the computer-aided design model of the object without being limited to topological constraints of the three-dimensional pattern; and
 (iii) producing the physical object embodying the modified object by applying information with respect to the modified shape.

* * * * *